United States Patent [19]

Asada et al.

[11] Patent Number: 5,091,341
[45] Date of Patent: Feb. 25, 1992

[54] METHOD OF SEALING SEMICONDUCTOR DEVICE WITH RESIN BY PRESSING A LEAD FRAME TO A HEAT SINK USING AN UPPER MOLD PRESSURE MEMBER

[75] Inventors: Junichi Asada, Yokohama; Kenji Takahashi, Tokyo; Toshiharu Sakurai, Kitakami, all of Japan

[73] Assignee: Kabushiki Kaisha Toshiba, Kawasaki, Japan

[21] Appl. No.: 524,434

[22] Filed: May 17, 1990

[30] Foreign Application Priority Data

May 22, 1989 [JP] Japan .................. 1-128399

[51] Int. Cl.⁵ .................. H01L 21/56; H01L 21/58; H01L 21/60; H01L 21/603
[52] U.S. Cl. .................. 437/212; 437/214; 437/220; 437/902; 357/81
[58] Field of Search .................. 425/469, 121, 123, 116, 425/117, 577, DIG. 243, DIG. 247; 249/83, 89, 85, 91, 95; 437/902, 214, 215, 216, 217, 219; 264/272.17, 272.15, 272.14, 275, 277, 278, 272.11; 174/52.5, 52.2, 52.6; 357/81; 361/381, 421

[56] References Cited

U.S. PATENT DOCUMENTS

| | | | |
|---|---|---|---|
| 3,729,573 | 4/1973 | Dunn | 357/81 |
| 4,377,548 | 3/1983 | Pierpont | 264/278 |
| 4,470,786 | 9/1984 | Sano et al. | 264/272.14 |
| 4,626,185 | 12/1986 | Monnet | 425/121 |
| 4,823,234 | 4/1989 | Konishi et al. | 357/81 |
| 4,954,307 | 9/1990 | Yokohama | 264/272.14 |

FOREIGN PATENT DOCUMENTS

| | | | |
|---|---|---|---|
| 58-7322 | of 1983 | Japan | 249/83 |
| 59-63735 | of 1984 | Japan | 437/217 |
| 59-65437 | of 1984 | Japan | 437/319 |
| 61-234536 | of 1986 | Japan | 425/117 |
| 63-175435 | of 1988 | Japan | 425/123 |

OTHER PUBLICATIONS

Nikkei Micro Devices, Nov., 1988, pp. 74–75, "News Probe".

Primary Examiner—Olik Chaudhuri
Assistant Examiner—David E. Graybill
Attorney, Agent, or Firm—Foley & Lardner

[57] ABSTRACT

A method of sealing a semiconductor device with resin includes the steps of coupling the tie bar of a lead frame to a heat sink; die bonding a semiconductor chip to the surface of the heat sink; wire bonding and electrically connecting the semiconductor chip to leads of the lead frame; placing the heat sink on the bottom surface of a cavity of a lower mold, putting an upper mold on the lower mold, and pressing down the coupling portion between the heat sink and lead frame toward the bottom surface by using a pressure member mounted on the upper mold; and injecting melted resin within the cavity defined by the upper and lower molds, and hardening the resin.

4 Claims, 5 Drawing Sheets

METHOD OF SEALING SEMICONDUCTOR DEVICE WITH RESIN BY PRESSING A LEAD FRAME TO A HEAT SINK USING AN UPPER MOLD PRESSURE MEMBER

BACKGROUND OF THE INVENTION

The present invention relates to a method of sealing a semiconductor device with resin, and more particularly to a method of resin molding a device having a heat sink or thermal radiation board.

Conventionally, sealing a semiconductor device having a heat sink with resin has been carried out in the following manner.

First, glass powder is deposited on the upper surface of a heat sink, and a lead frame is put on the glass powder and then these are heated to a temperature of about 350° C. The melted glass powder bonds together the lead frame and heat sink in an electrically insulating state. A semiconductor chip is die-bonded on the upper surface of an island which is located at the center of the lead frame. Then, pads of the semiconductor chip and the tips of inner leads of the lead frame are bonded together by means of wires.

Next, the heat sink together with the semiconductor chip and lead frame is placed on the bottom surface of a lower mold within its cavity, and an upper mold is mounted on the lower mold to enclose the cavity defined by the upper and lower molds.

Melted resin is injected by a transfer molding method into the cavity defined by the upper and lower molds. After the resin is hardened, the resin sealed semiconductor is picked up by removing the upper and lower molds.

With the above resin sealing method, however, melted resin is injected within the cavity defined by the upper and lower molds, and some of melted resin may flow into a small gap between the heat sink and the bottom surface of the lower mold. Therefore, the bottom surface of the heat sink of a finished semiconductor device is often covered with resin which obstructs the heat dissipation from the surface of the heat sink. To avoid this, there has been proposed a method wherein a peripheral portion of the heat sink is projected downward and is made in tight contact with the bottom surface of the lower mold to thereby prevent melted resin from flowing toward the bottom of the heat sink. It has been found, however, that this method cannot fully prevent such resin flow.

Further, the lead frame may sometimes deformed (bent or warped) while resin is injected so that there is associated with a problem of poor workability in mounting a semiconductor device on a printed wiring board.

SUMMARY OF THE INVENTION

It is therefore an object of the present invention to provide a method of sealing a semiconductor device with resin, capable of obtaining a semiconductor device having an excellent heat dissipation performance by preventing resin from flowing toward the bottom surface of a heat sink, and capable of preventing a lead frame from being deformed.

According to the present invention, there is provided a method of sealing a semiconductor device with resin comprising the steps of: coupling a tie bar of a lead frame to a heat sink; die bonding a semiconductor chip to the surface of said heat sink; wire bonding for electrically connecting said semiconductor chip to leads of said lead frame; placing said heat sink on the bottom surface of a cavity of a lower mold, putting an upper mold on said lower mold, and pressing down the coupling portion between said heat sink and lead frame toward said bottom surface by using a pressure member mounted on said upper mold; and injecting melted resin within the cavity defined by said upper and lower molds, and hardening said resin.

The coupling portions between the heat sink and lead frame are pressed down toward the bottom surface of the lower mold, so that a gap is not formed between the heat sink and the bottom surface of the lower mold. As a result, injected resin will not flow towards the surface of the heat sink. Resin does not attach to the surface of the heat sink so that the heat sink surface is exposed in atmosphere, and therefore prevents the heat dissipation performance from being degraded. In addition, the lead frame is also pressed down toward the cavity bottom surface of the lower mold during resin injection, lead frame deformation can be avoided to thus improve its flatness. Furthermore, a semiconductor chip is made in direct contact with the surface of the heat sink, thereby further improving the heat dissipation performance as compared with the case where it is placed on the heat sink with the lead frame being interposed therebetween.

The heat sink and lead frame are pressed down at the coupling portions therebetween toward the bottom surface of the lower mold, upon depression of the pressure jig having rods or plates which are inserted into holes or slits formed in the upper mold.

The heat sink may be formed with a recess whose depth is substantially the same as the thickness of a semiconductor chip. The thinner portion of the heat sink is used as the coupling portion between the heat sink and the semiconductor chip, whereas the thicker portion is used as the coupling portion between the heat sink and the tie bars of the lead frame. In such an arrangement, a good workability in wire bonding together the lead frame and semiconductor chip can be ensured, avoiding breakage of a wire. Since the coupling portion between the heat sink and the semiconductor chip is thin, thermal conductivity of heat generated by the chip is excellent to thereby improve the heat dissipation performance.

DESCRIPTION OF THE PREFERRED EMBODIMENTS

A method of sealing a semiconductor device with resin according to the first embodiment of this invention will be described with reference to Figs. 1A to 1D which are sectional views of a semiconductor device and molds with a pressure jig. These sectional views are taken along line A—A shown in FIG. 2 which is a plan view of a semiconductor device sealed with resin according to this method.

Figure 1A:
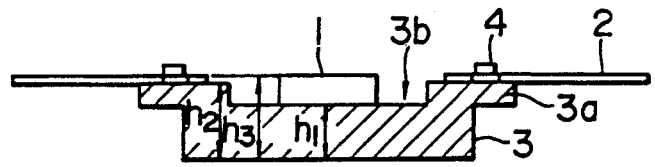
FIG. 1A to 1D are sectional views of assembling processes used for explaining a resin sealing method according to a first embodiment of this invention.

First, a lead frame 2 is mounted on the upper surface of a heat sink 3 which is different from a conventional one. Namely, as shown in FIG. 1A, the heat sink 3 is formed with a recess 3b whose depth is substantially the same as the thickness of a semiconductor chip 1. The thickness h1 of the heat sink 3 at the position where the semiconductor chip 1 is placed, is made smaller than the thickness h2 at the position where the lead frame 2 is coupled. The surface of the semiconductor chip 1 and that of the lead frame are made flush with each other at the height h3.

Figure 3:
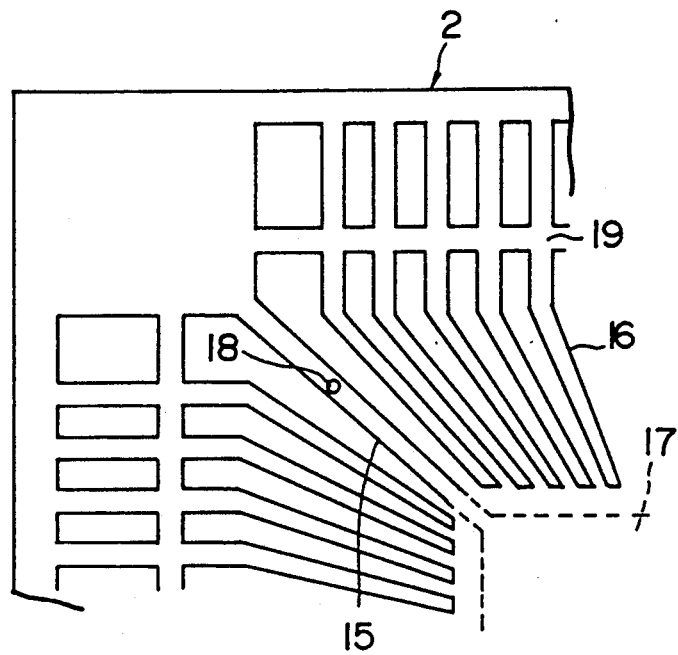
FIG. 3 is an enlarged plan view of a lead frame to be used with this invention.

The lead frame 2 has a configuration as shown in FIG. 3. A conventional lead frame has an island which is supported by four corner tie bars 15 at the center of the frame as indicated by a broken line. In this embodiment, such an island is not formed. In addition, each of the four corner tie bars 15 is formed with a hole 18 through which the frame 2 is coupled to the heat sink 3 by means of riveting, screwing or the like. A reinforcing bar 19 is used to couple respective leads 16 so as not to allow deformation thereof during the manufacturing processes. A tie bar support portion 3a of the heat sink 3 is formed with a projection 4 as shown in FIG. 1A which is inserted into the hole 18 and caulked for the coupling of the frame 2 to the heat sink 3.

Figure 2:
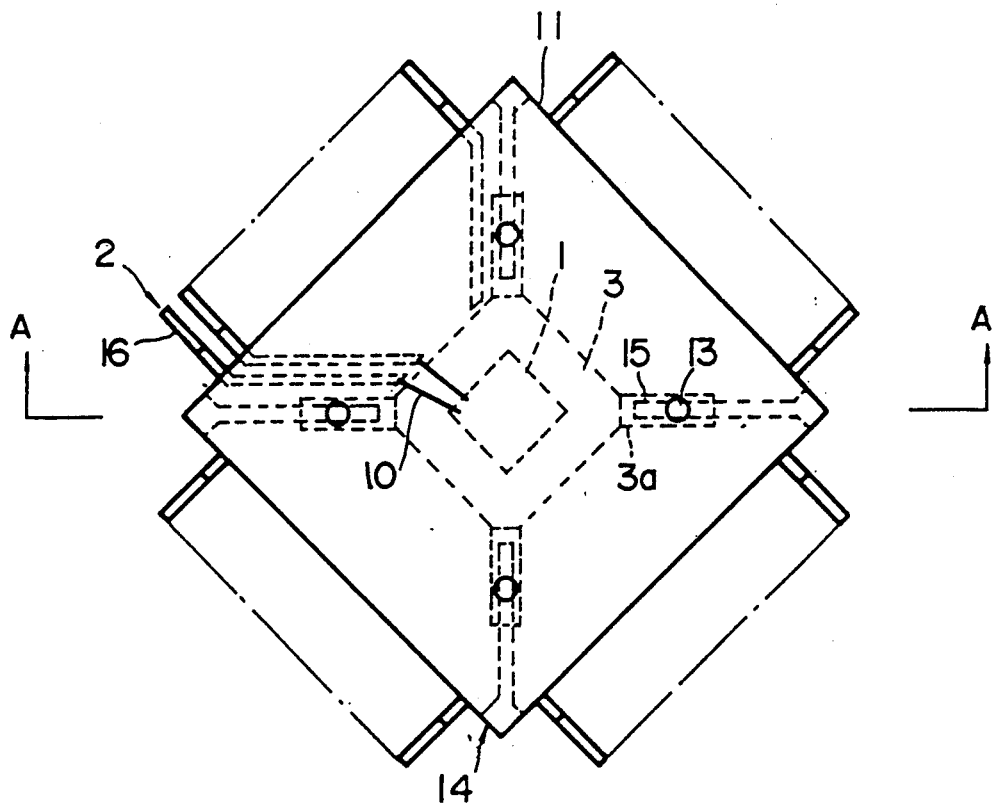
FIG. 2 is a plan view of a semiconductor device sealed with resin.

FIG. 2 shows the coupling state of the heat sink 3 and lead frame 2. The four outwardly extending tie bar support portions 3a of the heat sink 3 are coupled to the tie bars 15 of the lead frame 2. Next, the semiconductor chip 1 is placed at the center of the heat sink 3 and directly die bonded with mounting material to the upper surface of the heat sink 3 without interposing the lead frame 2 therebetween (FIG. 1A). The heat sink 3 is shaped as shown in FIG. 2 so as not to become in contact with the leads 16 of the lead frame 2.

Figure 1B:
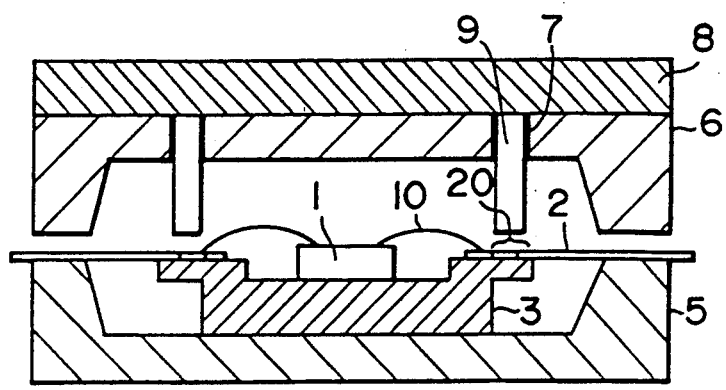
Figure 1C:
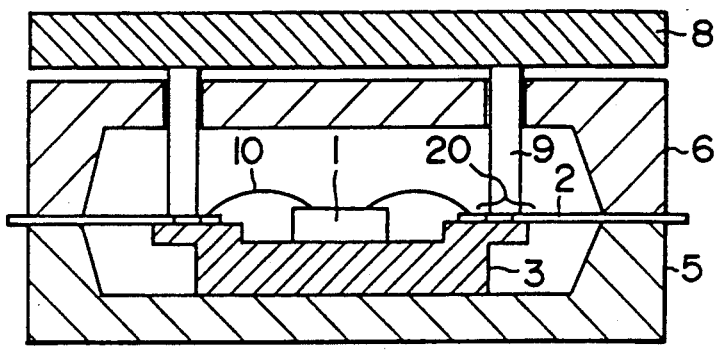
Figure 4:
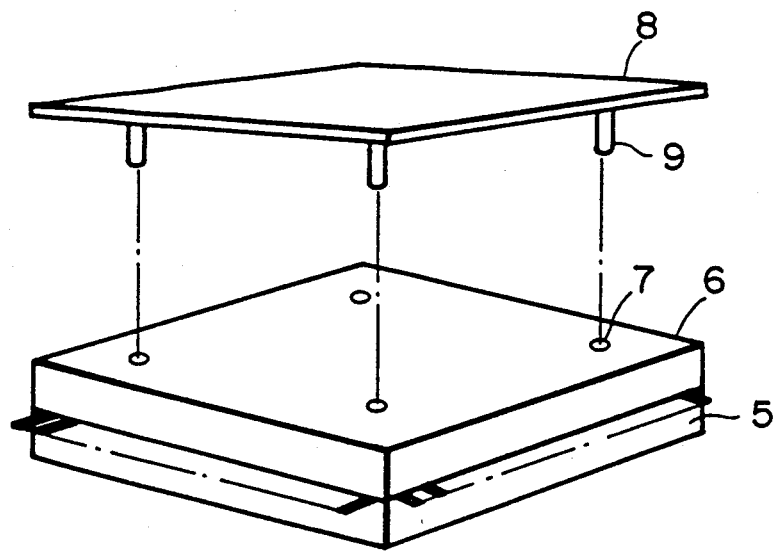
FIG. 4 is a perspective view showing a relationship between molds and a pressure jig.

Thereafter, pads of the semiconductor chip 1 and leads 16 of the lead frame 2 are interconnected with wires 10. The heat sink 3 is then placed on the bottom surface of the cavity of a lower mold 5. An upper mold 6 mounted with a pressure jig 8 is put on the lower mold 5. FIG. 4 is a perspective view showing the relationship between the upper and lower molds 6 and 5 and a pressure jig 8. The pressure jig 8 is formed with four rods 9 which are inserted into four holes 7 of the upper mold 6 to press coupling portions 20. To this end, the length of each rod 9 is set to slightly longer than the thickness of the upper mold 6. Each hole 7 corresponds in position to the coupling portion 20 between the lead frame 2 and heat sink 3 (FIG. 1B). When the upper mold 6 mounted with the pressure jig 8 is put on the lower mold 5, the pressure jig 8 takes a position slightly above the upper mold 6. The coupling portion 20 can therefore be pressed by applying an external force to the pressure jig 8. Under this state, melted resin is injected within the cavity defined by the upper and lower molds 6 and 5 (FIG. 1C).

Figure 1D:
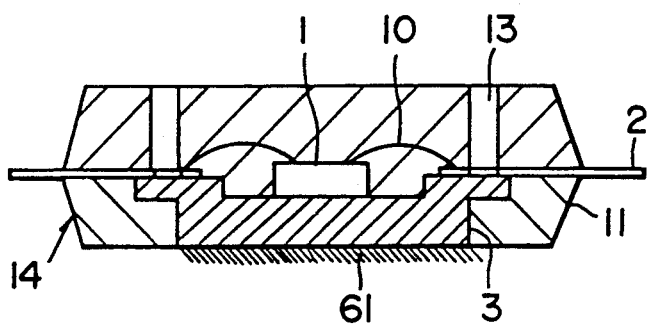

After the resin 11 is hardened, a finished semiconductor device 14 is obtained by removing the upper and lower molds 6 and 5 (FIG. 1D).

The above-described method has the following advantages.

Since the coupling portions 20 between the lead frame 2 and heat sink 3 are pressed while resin is injected within the cavity of the upper and lower molds 6 and 5, a gap is not formed between the heat sink 3 and the bottom surface of the lower mold 5, thereby preventing melted resin from flowing toward the bottom surface of the lower mold 5. Accordingly, resin is not attached to the bottom surface 61 of the semiconductor device 14 so that the surface of the heat sink 3 is fully exposed to thus attain excellent heat dissipation performance.

Furthermore, since the coupling portions 20 between the lead frame 2 and heat sink 3 are pressed, it is possible to prevent deformation of the lead frame 2 while resin is injected, thereby improving workability in mounting a semiconductor device on a printed circuit board.

Since the semiconductor chip 1 is directly mounted on the heat sink 3, heat generated by the chip 1 directly propagates to the heat sink 3 without passing through the lead frame 2, thus providing excellent heat dissipation performance.

Furthermore, the upper surface of the lead frame and the pads on the semiconductor chip 1 are set at the same height so that wire bonding can be easily carried out. Since the heat sink is formed with a recess, the thickness h1 of the heat sink 3 at the position where the semiconductor chip 1 is placed, is smaller than conventional. Accordingly, not only good wire bonding but also good thermal conductivity can be attained.

In contrast with a conventional heat sink having a generally flat shape, the heat sink 3 of the first embodiment has step portions. Such step portions allow tight contact of resin to the heat sink and prevent crack generation, irrespective of thermal shrink which may occur when melted resin at high temperature is cooled or when the resin is heated at the time of soldering the semiconductor device 11 to a printing wiring board.

Next, a method of sealing a semiconductor device with resin according to the second embodiment will be described. FIGS. 5A to 5D are sectional views of 15 assembling processes according to this method. These sectional views are taken along line B—B of FIG. 6 which is a plan view of a semiconductor device sealed with resin according to this method.

Figure 5A:
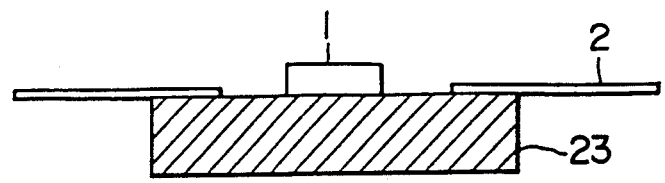
FIGS. 5A to 5D are sectional views of assembling processes used for explaining a resin sealing method according to a second embodiment of this invention.

Different from the first embodiment, this embodiment uses a heat sink having no recess. Coupling between the heat sink 23 and lead frame 2 is carried out by means of welding, although the first embodiment uses caulking. Next, a semiconductor chip is placed on the heat sink 23 at the center thereof and directly die bonded with a mounting material (adhesive) to the heat sink 3 without interposing the lead frame 2 therebetween (FIG. 5A).

Figure 5B:
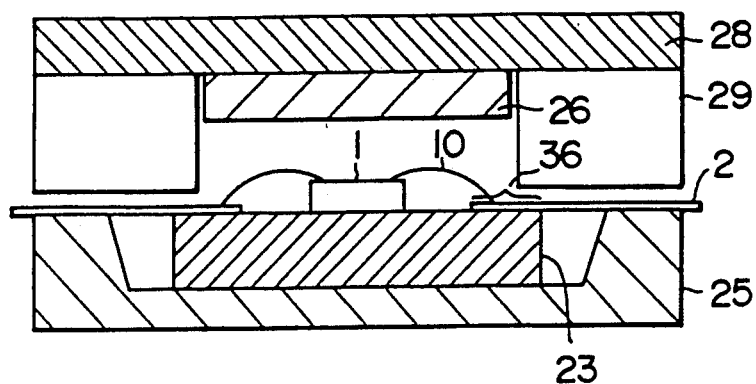
Figure 7:
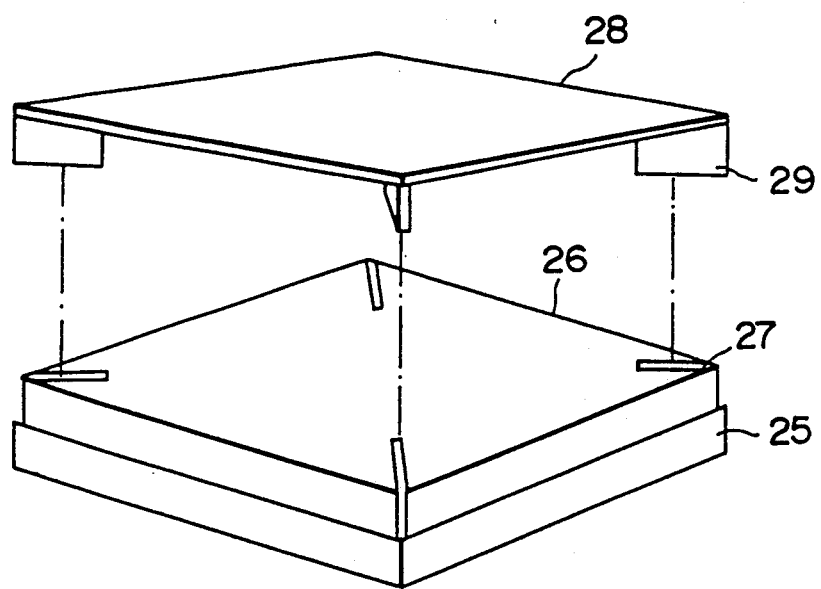
FIG. 7 is a perspective view showing a relationship between molds and another pressure jig.

Thereafter, pads on the semiconductor chip 1 and leads 16 of the lead frame 2 are bonded with wires 10. The heat sink 23 is then placed on the cavity bottom surface of a lower mold 25. An upper mold 26 mounted with a pressure jig 28 is put on the lower mold 25. Although circular holes 7 are formed in the upper mold of the first embodiment, in this embodiment four slits 27 are formed in the upper mold 26 as shown in FIG. 7. Inserted into these four slits 27 are four thin plates 29 of the pressure jig 28 for which plates outwardly extend from coupling portions 36 between the lead frame 2 and heat sink 23. Accordingly the coupling portions 36 are pressed down by the four thin plates 29 (FIG. 5B).

Figure 5C:
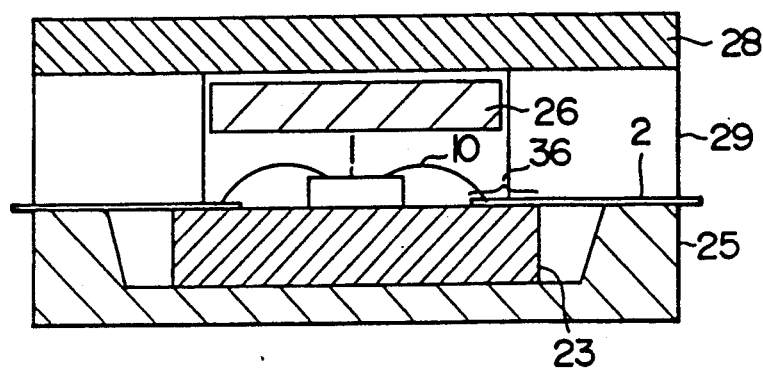

Next, an external downward force is applied to the pressure jig 28 so that the coupling portions 20 between the lead frame 2 and heat sink 23 are pressed down. Under this state, melted resin is injected within the cavity defined by the upper and lower molds 26 and 25 (FIG. 5C).

Figure 6:
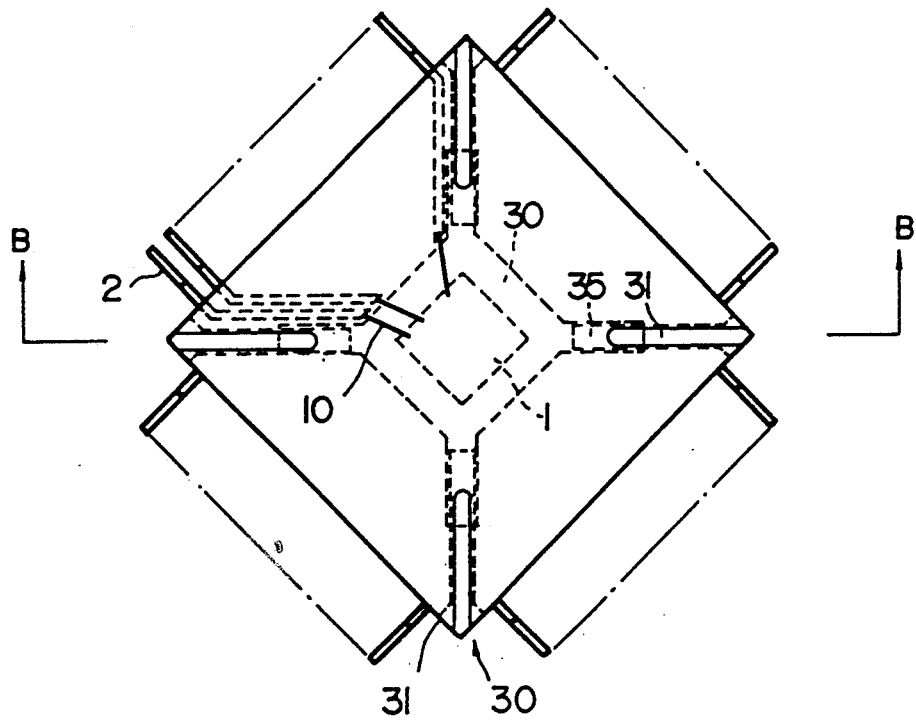
FIG. 6 is a plan view of a semiconductor device sealed with resin according to the method illustrated in FIGS. 5A to 5D.
Figure 5D:
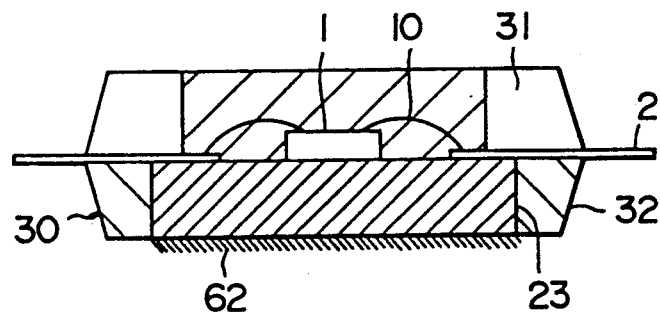

After the resin 32 is hardened, a finished semiconductor device 30 is obtained by removing the upper and lower molds 26 and 25 (FIG. 5D). As seen from FIG. 6 showing the plan view of the semiconductor device 30, four diagonally extending slits 31 are formed in the device 30 in correspondence with the flat plates 29 of the pressure jig 28.

The above-described method has the following advantages.

Similar to the first embodiment, since the coupling portions 36 between the lead frame 2 and heat sink 23 are pressed down toward the bottom surface of the lower mold 25 while resin is injected within the cavity of the upper and lower molds 26 and 25, there is formed no gap between the heat sink 23 and the bottom surface of the lower mold 25, thereby preventing melted resin from flowing toward the bottom surface of the lower mold 25. Accordingly, resin is not attached to the bottom surface 62 of the semiconductor device 30 so that the surface of the heat sink 23 is fully exposed to thus attain excellent heat dissipation performance. Although the heat sink 23 is thicker than that of the first embodiment, sufficient heat dissipation performance can be ensured. Furthermore, since the coupling portions 36 between the lead frame 2 and heat sink 23 are pressed, it is possible to prevent deflection of the lead frame 2 while resin is injected, thereby improving the workability in mounting a semiconductor device on a printing circuit board.

Since the semiconductor chip 1 is directly placed on the heat sink 23, heat generated by the chip 1 directly propagates to the heat sink 23 without passing through the lead frame 2, thus providing excellent heat dissipation performance.

The above embodiments are not intended to limit the scope of this invention. For example, coupling between the heat sink and lead frame may be carried out by means of not only riveting and screwing but also by welding. Furthermore, although pressing the coupling portion between the lead frame and heat sink toward the cavity bottom surface during injection of resin has been carried out by means of pressure jig, other method may be used on condition that there is formed no gap between the heat sink and the bottom surface of the lower mold. For example, a press may be used.

Instead of putting the upper mold mounted with the pressure jig on the lower mold, the pressure jig may be mounted after both the upper and lower molds are mounted.

What is claimed is:

1. A method of sealing a semiconductor device with resin comprising the steps of:
   preparing a lead frame having a tie bar and leads;
   coupling said tie bar of the lead frame onto a tie bar support section of a heat sink;
   die bonding a semiconductor chip to the surface of said heat sink;
   wire bonding for electrically connecting said semiconductor chip to leads of said lead frame;
   placing said heat sink on the bottom surface of a cavity of a lower mold, putting an upper mold on said lower mold, and pressing down the tie bar coupled to said heat sink toward said bottom surface by using a pressure member mounted on said upper mold; and
   injecting melted resin within the cavity defined by said upper and lower molds, and hardening said resin.

2. A method according to claim 1, wherein said pressing down of said heat sink toward the bottom surface of the cavity of said lower mold is carried out by inserting a rod type pressure member into a through hole formed in said upper mold.

3. A method according to claim 1, wherein said pressing down of said heat sink toward the bottom surface of the cavity of said lower mold is carried out by inserting a plate type pressure member into a through slit formed in said upper mold.

4. A method according to claim 1, wherein said heat sink is formed with a recess whose depth is substantially the same as the thickness of said semiconductor chip, and the thinner portion of said heat sink is used as the die bonding portion for the semiconductor chip and the thicker portion is used as the coupling portion with said tie bar portion of the lead frame.

* * * * *